(12) United States Patent
Sukekawa

(10) Patent No.: US 9,245,893 B1
(45) Date of Patent: Jan. 26, 2016

(54) SEMICONDUCTOR CONSTRUCTIONS HAVING GROOVES DIVIDING ACTIVE REGIONS

(71) Applicant: Micron Technology, Inc., Boise, ID (US)

(72) Inventor: Mitsunari Sukekawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/547,356

(22) Filed: Nov. 19, 2014

(51) Int. Cl.
| | |
|---|---|
| H01L 21/8238 | (2006.01) |
| H01L 29/40 | (2006.01) |
| H01L 23/52 | (2006.01) |
| H01L 21/02 | (2006.01) |
| H01L 27/108 | (2006.01) |
| H01L 29/78 | (2006.01) |
| H01L 21/762 | (2006.01) |

(52) U.S. Cl.
CPC ...... H01L 27/10891 (2013.01); H01L 29/7827 (2013.01); H01L 21/76224 (2013.01)

(58) Field of Classification Search
CPC ............... H01L 27/10864; H01L 21/823497; H01L 29/66712
USPC ........................... 257/296, E27.084; 438/243
See application file for complete search history.

(56) References Cited

U.S. PATENT DOCUMENTS

| | | | |
|---|---|---|---|
| 7,795,620 B2* | 9/2010 | Huang | 257/68 |
| 7,910,986 B2 | 3/2011 | Takaishi | |
| 2011/0068384 A1* | 3/2011 | Kim et al. | 257/302 |
| 2013/0026471 A1 | 1/2013 | Zahurak et al. | |
| 2013/0126954 A1* | 5/2013 | Wu et al. | 257/296 |
| 2013/0240965 A1* | 9/2013 | Park et al. | 257/296 |
| 2013/0334583 A1* | 12/2013 | Yang | 257/306 |
| 2014/0110781 A1* | 4/2014 | Hwang | 257/330 |

* cited by examiner

Primary Examiner — Julio J Maldonado
Assistant Examiner — Moazzam Hossain
(74) Attorney, Agent, or Firm — Wells St. John P.S.

(57) ABSTRACT

Some embodiments include semiconductor constructions having an active region surrounded by insulating material. A groove crosses the active region to divide the active region into first and second portions. A conductive wordline material is within the groove. First and second diffusion regions are within the first portion of the active region, and vertically arranged to sandwich a part of the first portion therebetween. Third and fourth diffusion regions are within the second portion of the active region, and are vertically arranged to sandwich a part of the second portion therebetween. First and second conductive regions are in electrical contact with the first and second diffusion regions, respectively. Third and fourth conductive regions are in an electrical contact with the third and fourth diffusion regions, respectively.

17 Claims, 12 Drawing Sheets

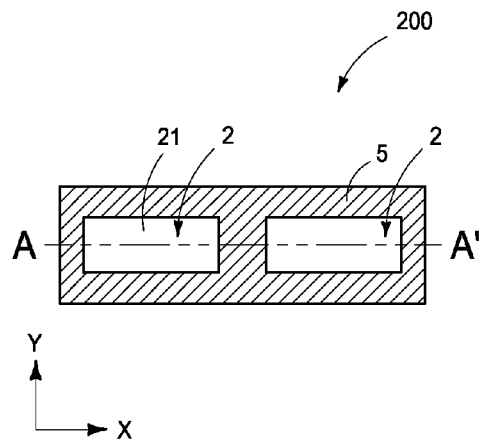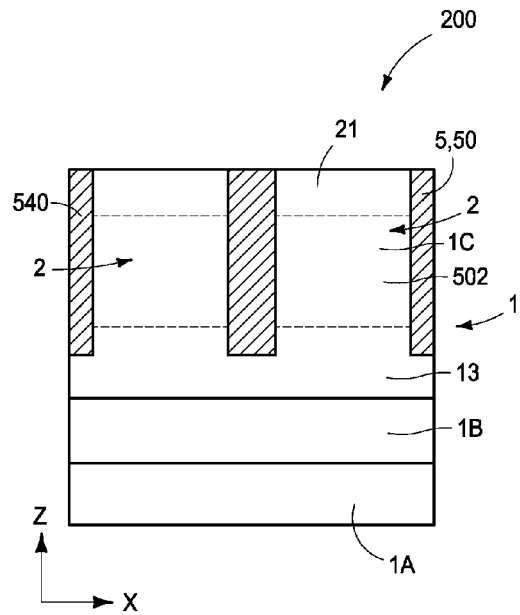
FIG. 4 (a)    FIG. 4 (b)
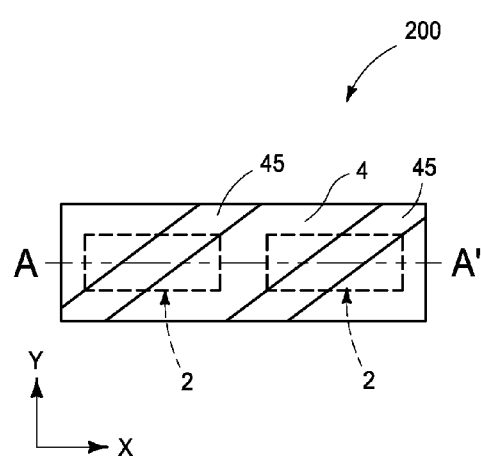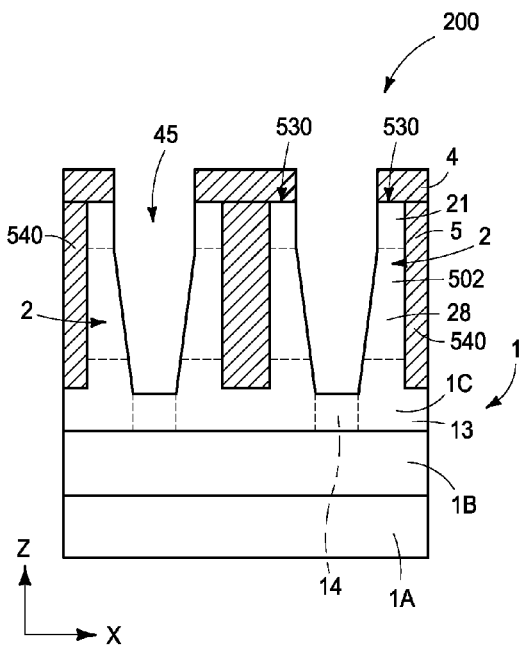
FIG. 5 (a)    FIG. 5 (b)

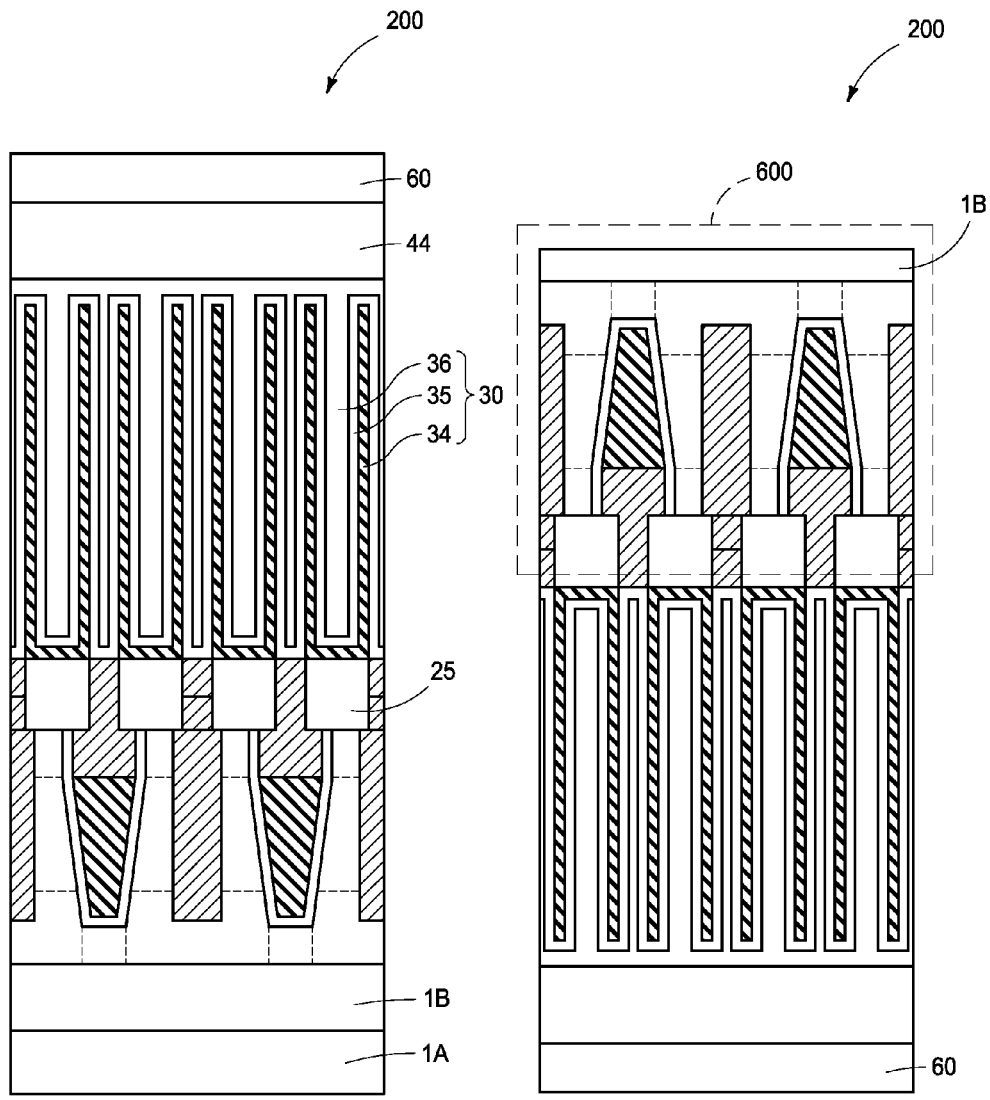

SEMICONDUCTOR CONSTRUCTIONS HAVING GROOVES DIVIDING ACTIVE REGIONS

TECHNICAL FIELD

Semiconductor constructions having grooves dividing active regions.

BACKGROUND

Pillar-type transistors (vertical transistors) may have desirability in terms of size and scalability. In such pillar-type transistors, diffusion layers comprising sources and drains are formed at upper and lower portions of pillars, and channels are formed between the sources and the drains within the pillars. Bitlines may be disposed on lower portions of pillar-type transistors for utilization in memory (e.g., dynamic random access memory (DRAM)).

There is a continuing goal to improve architectural layouts of integrated circuit structures in an effort to maintain acceptable electrical connections between components while achieving ever higher levels of integration. It is desired to improve architectural characteristics of pillar-type transistors.

BRIEF DESCRIPTION OF THE DRAWINGS

FIGS. 3(a) to 7(a), 10(a) and 11(a) are plan views of respective manufacturing steps of a first example embodiment manufacturing method.

FIGS. 3(b) to 7(b), 8, 9, 10(b) and FIG. 11(b) are sectional views along A-A' in FIG. 2(a) of respective manufacturing steps of the first example embodiment manufacturing method.

DETAILED DESCRIPTION OF THE ILLUSTRATED EMBODIMENTS

In some embodiments, it is recognized that it is possible to reduce the cell region of a DRAM by utilizing vertical MOS transistors in combination with bitlines and gate electrodes provided within wordline grooves. The bitlines can be larger than a channel width of the vertical MOS transistors and can be formed of a metallic material, making it possible to reduce wiring resistances as compared to conventional devices of the prior art. The cell region footprint of the DRAM may be reduced by disposing gate electrodes and capacitors (or other suitable charge-storage devices) over the bitlines.

Figure 1:
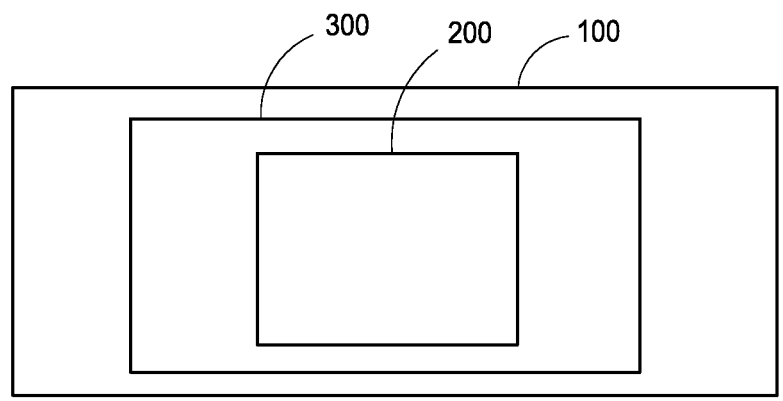
FIG. 1 is a block view of an example embodiment integrated circuit architecture.

A configuration of an example embodiment semiconductor construction is illustrated in FIG. 1. The example embodiment construction comprises integrated circuit architecture 100. The architecture 100 includes a memory cell region 200 (which may comprise, for example, DRAM), and includes a peripheral region 300 adjacent the memory cell region.

Figure 2:
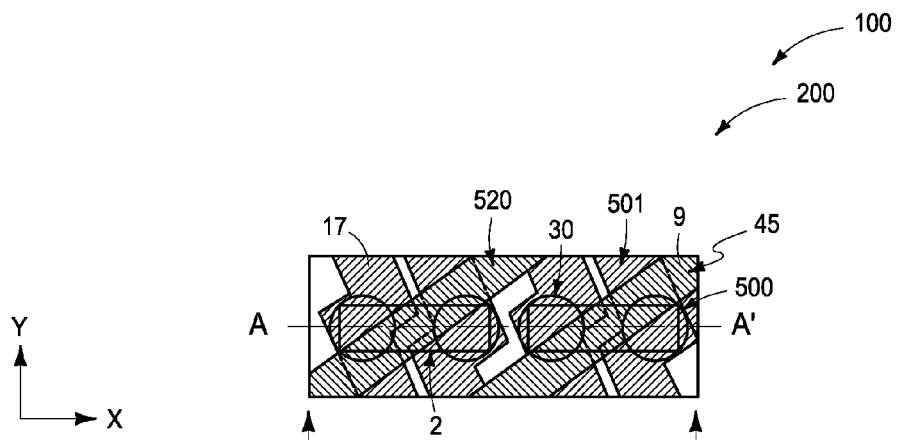
FIG. 2(a) is a plan view showing an example configuration of a memory cell region of the example embodiment architecture of FIG. 1.
FIG. 2(b) is a sectional view along line A-A' of FIG. 2(a).
FIG. 2(c) is an enlarged view of a region of FIG. 2(a).
FIG. 2(d) is a sectional view of a region along line B-B' of FIG. 2(c).
FIG. 2(e) is a schematic view of a region encompassing that of FIG. 2(a).
FIG. 2(f) is a diagrammatic view of a stacking arrangement of structures that may be present in active regions of FIG. 2e.
Figure 2:
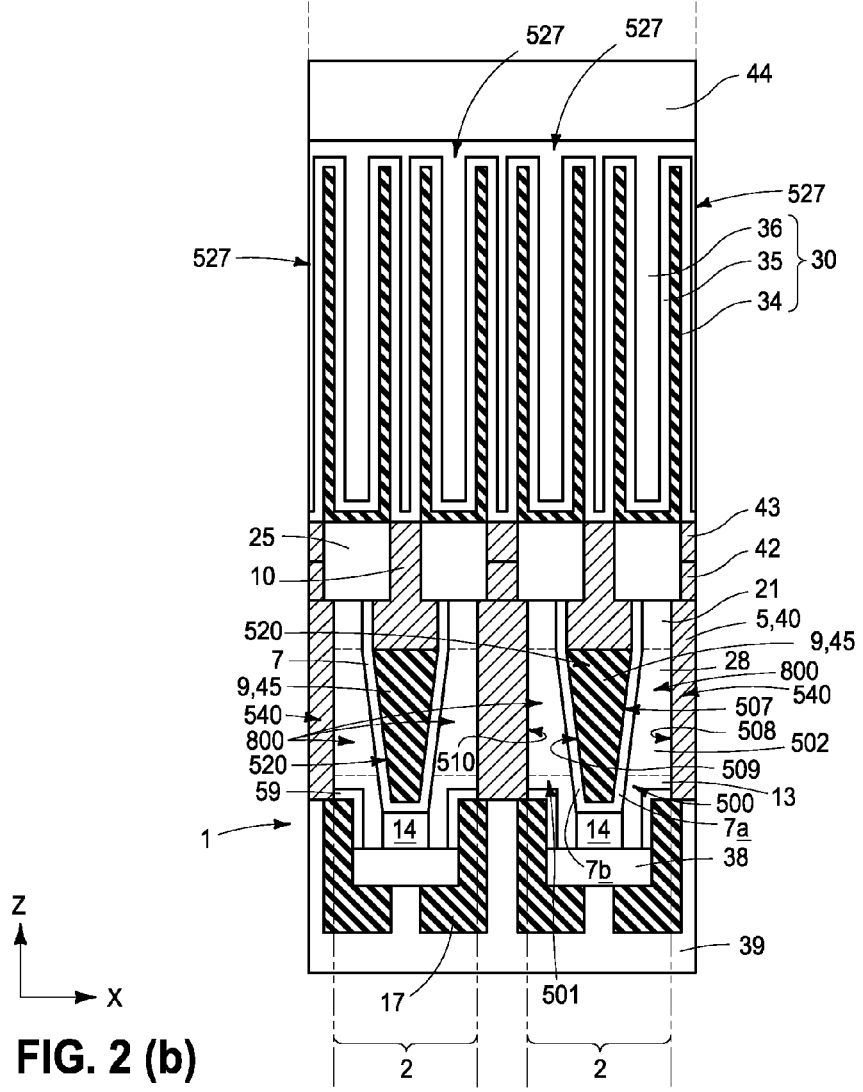
Figure 2:
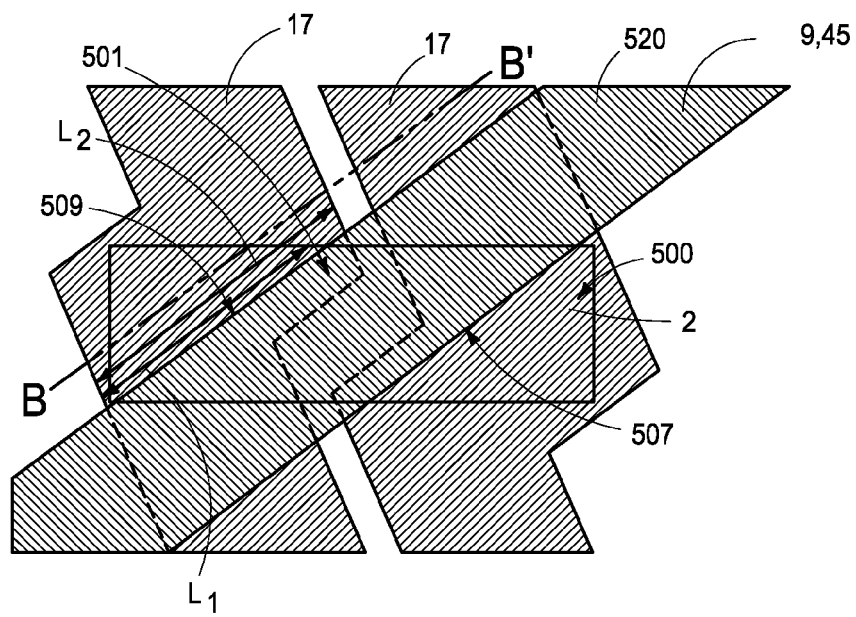
Figure 2:
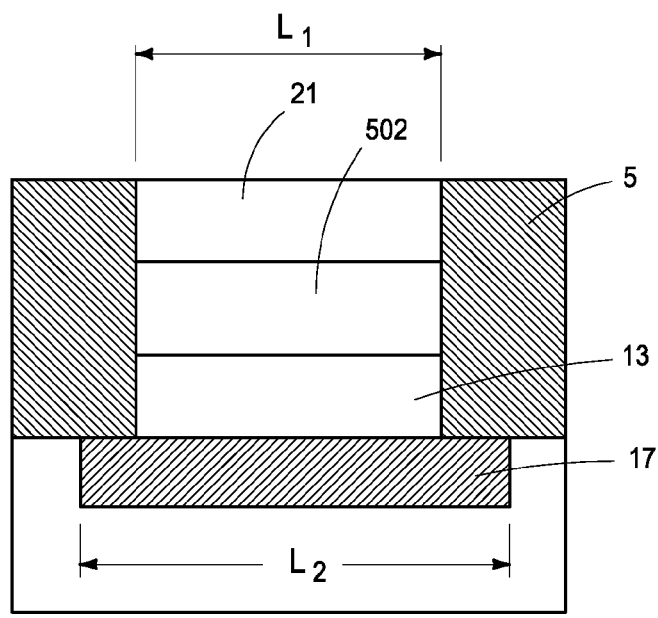
Figure 2:
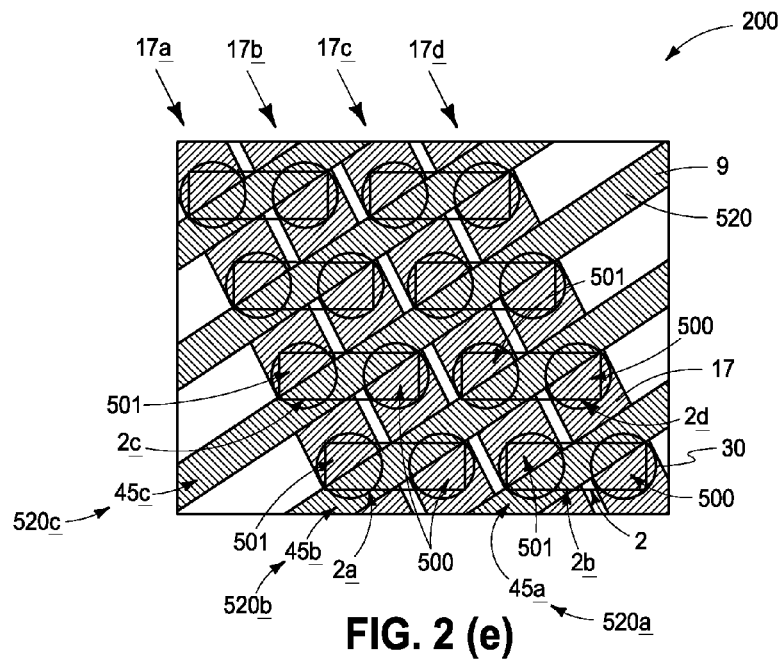

The memory region 200 is further explained with reference to FIG. 2.

FIG. 2(a) is a plan view showing an example configuration of the memory cell region 200. Outer peripheries of capacitors 30 are indicated by solid lines for clarifying an arrangement of various components. The capacitors are indicated to have circular peripheral shapes, but may have other shapes in other embodiments. FIG. 2(b) shows a section along line A-A' of FIG. 2(a).

A base (or substrate) 1 supports the various structures. The base 1 may comprise semiconductor material, and in some embodiments may comprise, consist essentially of, or consist of monocrystalline silicon. In some embodiments, base 1 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 1 may correspond to a semiconductor substrate containing one or more materials associated with integrated circuit fabrication.

An X-Y-Z coordinate system is used in the drawings. Direction Z (third direction) is a direction vertical to a main surface of the substrate 1, direction X (second direction) is a direction that is orthogonal to the direction Z in a plane that is horizontal to the main surface of the substrate 1, and direction Y (first direction) is a direction that is orthogonal to the direction X in a plane horizontal to the main surface of the substrate 1. This configuration is common to other embodiments as well.

The memory region 200 comprises vertical type metal oxide semiconductor (MOS) transistors 800 on the silicon substrate 1. The substrate 1 comprises a first conductivity type (for instance, p-type).

The vertical MOS transistors 800 are provided on active regions 2 that are isolated from one another by shallow trench isolation (STI) 540 comprising material 5 (for instance, silicon oxide). The STI may be considered an element isolating region of the silicon substrate 1.

The active regions 2 are examples of many active regions arranged in two-dimensional and matrix-like form. The STI material 5 corresponds to an insulating material within an element isolating groove 40 of the silicon substrate 1. Although the insulating material 5 is shown to be a single homogenous material, it may be a multilayered structure in other embodiments.

A groove 45 is provided at a central portion of one of the active regions 2 in the direction X; and such groove divides the active region 2 into two regions 500 and 501 (similar grooves are provided within the other active regions 2). The groove 45 may be formed by digging into a front surface (first main surface) of the silicon substrate. The groove has a top portion on the first main surface side and a bottom portion on a second main surface side opposing the first main surface. A conductive material 9 is within the groove 45.

In the DRAM of the example embodiment, the conductive material 9 provided in the grooves 45 will serve as wordlines 520. The grooves 45 may thus be referred to as wordline grooves. Regions of conductive material 9 within the MOS transistors will function as gate electrodes of the MOS transistors.

The vertical MOS transistors 800 include gate dielectric material 7 along inner walls of the wordline grooves for insulating the gate electrodes. The conductive material 9 (which, for example, may be made of a metallic material such as titanium nitride or tungsten) covers an inner surface portion of the gate dielectric material 7.

A first impurities diffusion region 13 is proximate a lower end of the conductive material 9 in the active region 2, and a second impurities diffusion region 21 is proximate an upper end of the conductive material 9. The first and second diffusion regions 13 and 21 are of a second conductive type (for instance, n-type), and are source/drain regions. A channel region 502 is vertically sandwiched between source/drain regions 13 and 21.

A wall of the wordline groove 45 is along a silicon pillar 28. The pillar 28 is part of the active region.

Gate dielectric material 7 is along the wordline groove 45, and between conductive material 9 and channel regions 502. A region of dielectric material 7 between first portion 500 and conductive material 9 may be referred to as a first dielectric layer 7a in some embodiments, and a region of dielectric material 7 between second portion 501 and conductive material 9 may be referred to as a second dielectric layer 7b.

The diffusion region 13 may be referred to as a bitline diffusion region or a lower diffusion region; and the diffusion region 21 may be referred to as a capacitor contact diffusion region or an upper diffusion region. The terms "upper" and "lower" refer to positional relationships along direction Z. The active region of the vertical MOS transistor extends vertically along the direction Z from the upper diffusion region to the lower diffusion region.

The conductive material 9 of a single wordline 520 may be shared by two vertical MOS transistors 800 located on opposing sides of the wordline. Accordingly, the two vertical MOS transistors can be simultaneously driven by a common gate electrode comprising the conductive material 9.

First conductivity type (e.g., p-type) regions 14 of silicon substrate 1 are positioned between the second conductivity type (e.g., n-type) diffusion regions 13 of adjacent vertical MOS transistors 800, and thus vertical MOS transistors that are located on opposing sides of a single wordline groove 45 are electrically isolated from each other. Electrical isolation of two vertical MOS transistors may be achieved by utilizing an insulating material instead of, or in addition to, providing the first conductivity type diffusion regions 14.

The upper diffusion region 21, channel region 502, and lower diffusion region 13 are in contact with the insulating material 5 inside of the element isolating groove 40.

The wordlines 520 may extend along in an intermediate direction between direction X and direction Y (i.e., a so-called oblique direction, hereinafter referred to as "first intermediate direction"); with individual wordlines extending across central regions of pluralities of the active regions.

An upper surface of the conductive material 9 is covered by a dielectric material 10 (which may be referred to as first buried dielectric material) and is insulated from an adjoining capacitor contact plug 25. Four vertical MOS transistors 800 are shown relative to the active regions 2 of FIG. 2(b). In actual practice, several thousand, several hundred thousand, etc., vertical MOS transistors may disposed in a memory cell array portion of an actual DRAM.

The vertical MOS transistors 800 of memory region 200 may be incorporated into memory cells 527. The transistors 800 are electrically coupled with bitlines 17, and thus the memory cells may be electrically coupled with the bitlines.

The bitlines 17 are electrically coupled with the impurities diffusion regions 13 through silicide material 59. The bitlines are under the conductive material 9 of wordlines 520.

The bitlines 17 contact regions of a bottom surface and side surface of a dielectric material 38 located along a bottom portion of the active region 2.

The bitlines 17 extend in a direction that intersects with the first intermediate direction in planar view (hereinafter referred to as a "second intermediate direction") and are in electrical contact with the first lower diffusion regions 13 of the active regions 2.

Adjacent bitlines 17 are insulated from one another with a dielectric material 39. In some embodiments, materials 38 and 39 may be referred to as first and second dielectric materials, respectively.

FIG. 2(c) is an enlarged view of a region of FIG. 2(a). The active region 2 is divided into the first and second portions 500/501 by the wordline groove 45 (or, alternatively, by the wordline 520). The first portion 500 includes a first side surface 507 defined by the wordline groove 45 and a second side surface 508 (shown in FIG. 2(b)) defined by the dielectric material 5 of STI 540 (shown in FIG. 2(b)). The second portion 501 includes a third side surface 509 defined by the wordline groove 45 and a fourth side surface 510 (shown in FIG. 2(b)) defined by the dielectric material 5 of STI 540 (shown in FIG. 2(b)).

FIG. 2(d) is a sectional view along B-B' in FIG. 2(c). As shown in FIG. 2(c) and FIG. 2(d), a length $L_1$ of the active region of the silicon substrate which the vertical MOS transistors contact is smaller than a length $L_2$ of the bitlines 17 that are present under the active region of the silicon substrate (as measured in the first intermediate direction in which the wordlines 520 extend). Silicide 59 (FIG. 2b) and dielectric 38 (FIG. 2b) are not shown in FIG. 2d to simplify the drawing.

Bottom surfaces of diffusion region 13 (i.e., bottom surfaces of the active region) are above upper surfaces of the bitlines 17. Widths of the bitlines with respect to the second intermediate direction in which the bitlines extend are larger than a channel width of the active region of the vertical MOS transistor. The utilization of relatively large widths of the bitlines may enable electrical resistance of the bitlines to be reduced relative to applications utilizing narrower bitlines.

The bitlines 17 may comprise any suitable materials, and, for example, may comprise a laminated metallic construction containing titanium nitride and tungsten. When using such metallic construction, the wiring resistance may be reduced to approximately one tenth as compared to a wiring resistance of bitlines consisting of conductively-doped semiconductor material.

Each of the example memory cells 527 of FIG. 2b includes a vertical MOS transistor 800 and a capacitor 30, and is a DRAM cell. The illustrated capacitors 30 are crown-type capacitors comprised of a lower electrode 34, a capacitor dielectric material 35 and an upper electrode 36.

The upper electrode 36 may comprise any suitable material or combination of materials. For instance, the upper electrode may comprise a buried (i.e., recessed) layer and a plate electrode on an upper surface of a buried layer. The capacitor 30 is not limited to the shown configuration. For instance, capacitor 30 is not limited to crown-type in which an inner wall portion and an outer wall portion are comprised by a capacitor portion. It is also possible to use a capacitor of a type using only the outer wall portion as the capacitor portion while the inner wall portion is not used as the capacitor portion, or of a type using only the inner wall portion as the capacitor portion while the outer wall portion is not used as the capacitor portion.

The second impurities diffusion regions 21 are connected to lower electrodes 34 with capacitor contact plugs 25. The plugs 25 are on upper surfaces of the second impurities diffusion regions 21. The plugs 25 may comprise any suitable electrically conductive material or combination of materials.

The capacitor contact plugs 25 are recessed into dielectric materials 42 and 43. The capacitors 30 are over the dielectric materials 42 and 43. Materials 42 and 43 may be referred to as a third dielectric material, and a second buried (or recessed) dielectric material, respectively, in some embodiments. Materials 42 and 43 may be referred to as third and fourth dielectric materials, respectively, in some embodiments.

The capacitors 30 are covered by an interlayer dielectric material 44. The capacitors 30 may be electrically connected to upper metallic wiring (not shown) provided on an upper surface of a contact plug (not shown). Such electrical connection may be accomplished by means of one or more contact plugs (not shown) provided inside of the interlayer dielectric material 44. Similarly, the wordlines 520, the bitlines 17, the p-type body diffusion regions and the silicon substrate of the channel regions of the vertical MOS transistors may be electrically connected to respective upper metallic wirings (not shown).

FIG. 2(e) is a diagrammatic schematic view of an area encompassing the region of FIG. 2(a). There are a plurality of active regions 2, a plurality of wordlines 520 crossing the active regions and extending along the first intermediate direction, and a plurality of bitlines 17 below the wordlines and extending along the second intermediate direction. Each of the active regions 2 comprises an upper diffusion region, a channel region and a lower diffusion region (as described above with reference to FIG. 2b)), and comprises vertical MOS transistors including regions of the wordlines (as described above with reference to FIG. 2(b)). The upper diffusion regions are electrically coupled with charge-storage devices (e.g. capacitors, as described above with reference to FIG. 2(b)), and the bitlines are electrically coupled with the lower diffusion regions (as discussed above with reference to FIG. 2(b)).

In some embodiments, FIG. 2(e) may be considered to show a first active region 2a, second active region 2b, third active region 2c and fourth active region 2d. The first and second active regions 2a and 2b are disposed along a first direction, and the third and fourth active regions 2c and 2d are also disposed along such first direction. The first and third active regions 2a and 2d are disposed along a second direction, and the second and fourth active regions 2b and 2c are also disposed along the second direction. The active regions 2a-d may be surrounded by an insulating layer comprising material 5 (with material 5 being shown FIG. 2(b)).

A first groove 45a crosses the second active region 2b and extends along a third direction. A second groove 45b crosses the first and fourth active regions 2a and 2d, and extends along the third direction. A third groove 45c crosses the third active region 2c and extends along the third direction. The first, second and third grooves divide each of the active regions 2a-d into first and second portions 500 and 501.

First, second and third wordlines 520a-c are within the first, second and third grooves (i.e., trenches) 45a-c, respectively.

First, second, third and fourth bitlines 17a-d extend below the wordlines, and along the second direction.

The active regions (for instance 2a) have end portions that are over conductive regions corresponding to bitlines 17 (for instance, active region 2a has an end portion over bitline 17a, and has another end portion over bitline 17b). FIG. 2f diagrammatically illustrates vertically-stacked constructions of active regions 2a and 2b, and it is to be understood that regions 2c and 2d would have analogous constructions to those of regions 2a and 2b. Each of the active regions 2a and 2b comprises the first and second portions 500 and 501; and each of such portions comprises a vertical stack comprising a bitline (17a-d), a source/drain region 13, a channel region 502, a source/drain region 21 and a capacitor 30. All of the vertically stacked structures 17, 13, 502, 21 and 30 are vertically above one another, as shown in FIG. 2(b).

In some embodiments, the diffusion regions 21 and 13 within a first portion 500 of an active region may be referred to as first and second diffusion regions, respectively; and the diffusion regions 21 and 13 within the second portion 501 of the active region may be referred to as third and fourth diffusion regions, respectively. The conductive plug 25 (FIG. 2(b)) in electrical contact with the first diffusion may be referred to as a first conductive region, the bitline in electrical contact with the second diffusion may be referred to as a second conductive region, the conductive plug 25 in electrical contact with the third diffusion may be referred to as a third conductive region, and the bitline in electrical contact with the fourth diffusion may be referred to as a fourth conductive region.

Embodiments described herein may enable the footprint of a cell region of a DRAM to be reduced relative to conventional constructions. For instance, improvements may be achieved with embodiments described herein by disposing bitlines that are beneath lower source/drain regions of vertical MOS transistors. When a wordline is selected (for instance, a wordline 520 of the embodiment of FIG. 2(b)), MOS transistors on both sides of the wordline turn on. However, read and write operations of each of the MOS transistors may be performed individually by selecting an appropriate bitline.

In some embodiments, a bitline width can be larger than a channel width of an associated vertical MOS transistor, and can comprise metallic material; which may enable reduction of wiring resistances. Reduction of the resistances of the bitlines may enable reduction of the number of sense amplifiers connected to the bitlines, which may enable reduction of the footprint of some of the integrated circuitry within the peripheral region of DRAM architecture 100 (FIG. 1).

FIGS. 3-11 are views of steps of an example embodiment manufacturing method which may be utilized to form the DRAM architecture 100 described above. FIGS. 3(a) to 7(a), 10(a) and 11(a) are plan views in the respective manufacturing steps, while FIGS. 3(b)-7(b), 8, 9, 10(b) and 11(b) are sectional views along A-A' of the plan views. It is noted that while it is possible to use a Si substrate as the semiconductor substrate, it is also possible to employ a silicon-on-insulator (SOI) substrate instead of the Si substrate.

Figure 3:
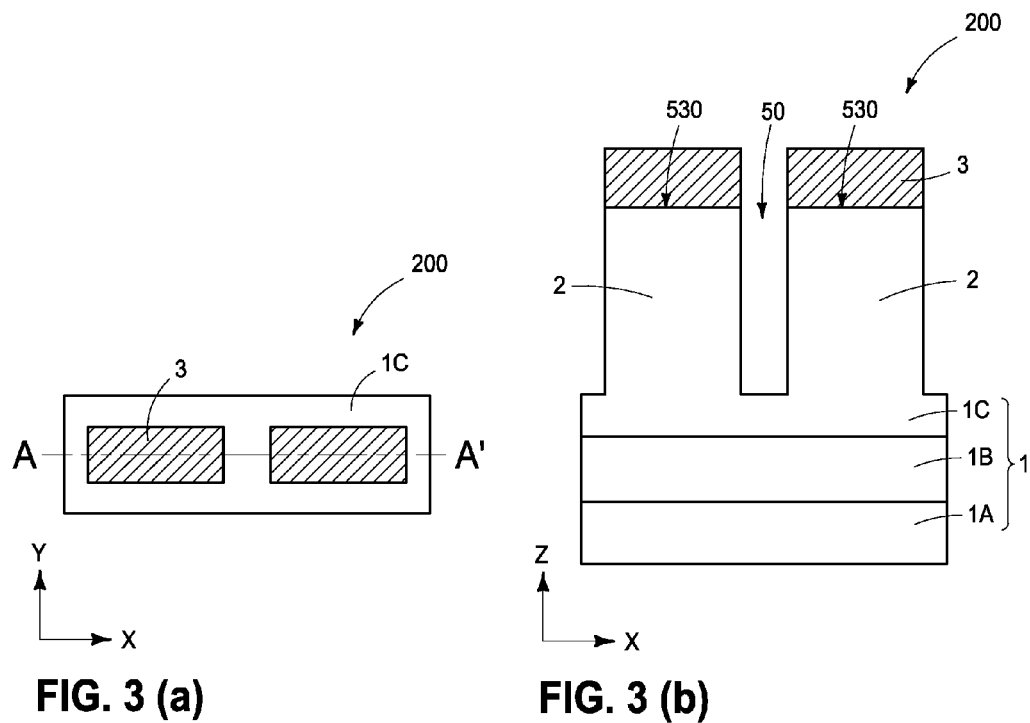
Figure 2:
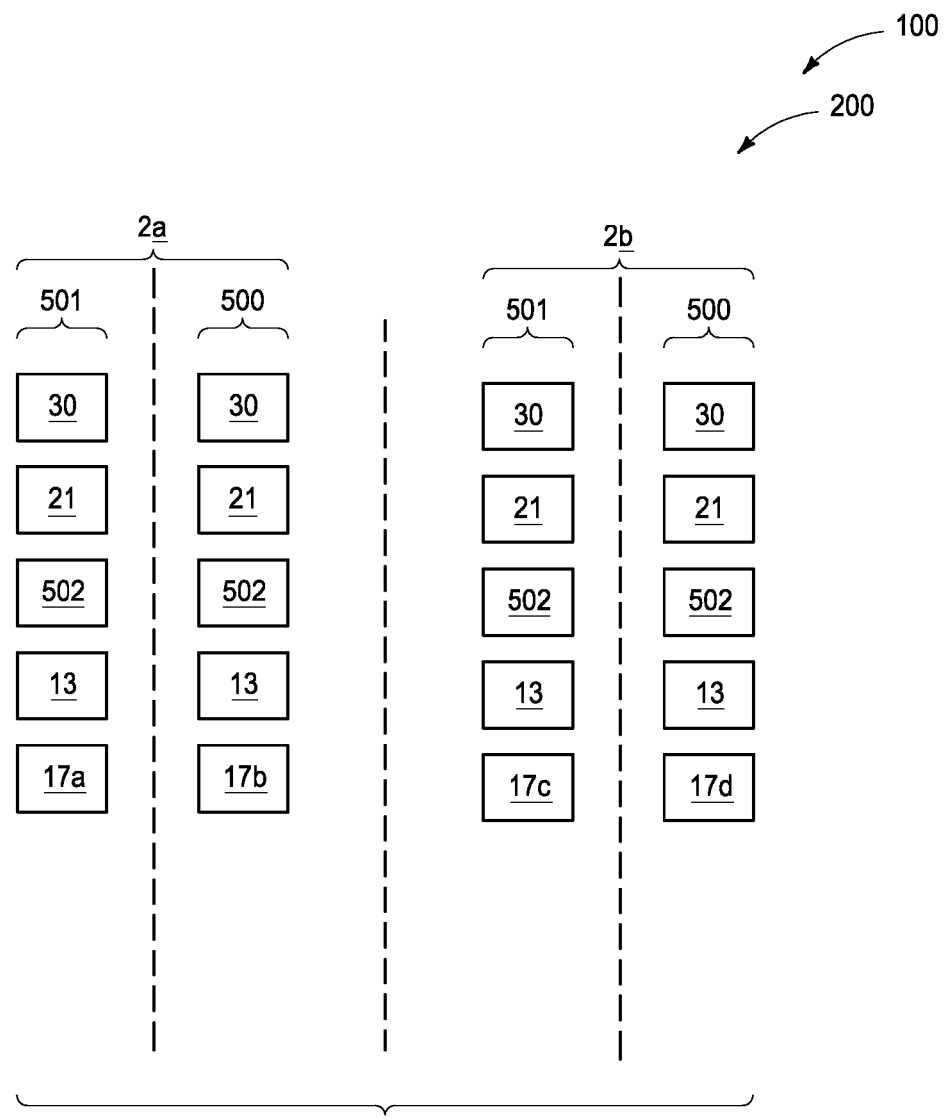

Referring to FIG. 3, an SOI substrate is used as a semiconductor substrate 1. The semiconductor substrate is comprised of a silicon-containing material 1A, a buried oxide (BOX) layer (or material) 1B made of a silicon oxide layer on an upper surface of the silicon substrate 1A, and a silicon-containing layer (or material) 1C on an upper surface of the BOX layer 1B. The silicon-containing material 1A may comprise monocrystalline silicon (which may be lightly p-type doped), and the silicon-containing material 1C may comprise p-type doped monocrystalline silicon. The silicon substrate 1A, the BOX layer 1B and the silicon layer 1C may be together referred to as a substrate 1, base 1, semiconductor substrate 1, or silicon substrate 1.

A first mask 3 (comprising, for example, silicon nitride) is formed on the upper surface of the silicon substrate 1 (for example, through chemical vapor deposition (CVD)). The mask 3 may have any suitable thickness, and may, for example, have a thickness of about 50 nm. The first mask 3 is patterned (for instance, utilizing photolithography and a dry etch); and, an isolating groove 50 is formed into the substrate 1 (the groove may be formed by, for example, a dry etch). The groove 50 may have any suitable dimension, and may, for example, have a thickness of about 250 nm and a width of about 20 nm. The isolating groove 50 comprises side surfaces of active regions 2. The active regions 2 are comprised by silicon-containing layer 1C. Portions of the active regions extend upwardly along direction Z above silicon-containing material 1A. Adjacent active regions 2 are isolated from one another by the isolating groove 50. The example active regions 2 are rectangular, with longer major axes extending along direction X in planar view. The groove 50 may be considered to extend into a first main surface 530 of silicon-containing material 1C.

Referring to FIG. 4, insulative material 5 (e.g., silicon oxide) is formed across an upper surface of the silicon substrate 1 and within groove 50. Material 5 may be formed by, for example, CVD. Thereafter, excess material 5 may be removed through planarization (e.g., chemical mechanical polishing (CMP)) to form the shallow trench isolation (STI) 540. The STI is an element isolating region formed by leaving the material 5 only at inner portions of the isolating grooves 50. Any remaining first mask 3 (FIG. 3) may be removed through wet etching or any other suitable technique. The upper surface of the STI 540 is flush with the upper surface of the silicon-containing material 1C. The STI 540 entirely surrounds lateral peripheries of active regions 2.

First impurities diffusion region 13 (for instance, made of n-type impurities) is formed on a lower portion of the silicon-containing material 1C through ion implanting, and second impurities diffusion region 21 (for instance, made of n-type impurities) is formed on an upper portion of the silicon-containing material 1C. The upper surface of the first impurities diffusion region 13 is located further upward than a bottom surface of the STI 540. The silicon substrate portion between the first impurities diffusion region 13 and the second impurities diffusion region 21 will be the channel region 502 of a vertical MOS transistor that is to be formed later.

Referring to FIG. 5, a second mask 4 (which may comprise, for example, silicon oxide) is formed over the upper surface of the silicon-containing material 1C. The mask 4 may have a thickness of, for example, about 50 nm; and may be formed utilizing CVD. The second mask 4 may patterned through photolithography and a dry etch. A patterned opening portion (not shown) extends along a first intermediate direction, and the silicon-containing material 1C and the STI 540 are exposed at a bottom surface of the opening portion. Wordline grooves 45 (for instance, grooves having a depth of about 250 nm and a width of about 20 nm) are formed to extend into the silicon-containing material 1C. Such may be formed with, for example, a dry etch.

The wordline grooves 45 are disposed at central portions of the active regions 2 in planar view. The silicon-containing material 1C and the STI 540 are exposed at side surfaces and bottom surfaces of the wordline grooves 45. The silicon-containing material 1C exposed at the side surfaces of the wordline grooves 45 has a pillar-shape and forms the pillars 28. The openings corresponding to wordline grooves 45 have a tapered shape extending downwardly from the main surface 530 of the silicon-containing material 1C such that the openings have wider upper portions and narrower bottom portions.

Third impurities diffusion regions 14 (for instance, made of p-type impurities) are formed in the silicon layer 1C along bottom surfaces of the wordline grooves 45 (for example, through ion implanting). The third impurities diffusion regions 14 may be p-type body diffusion regions. In some embodiments, channel regions 502 may be connected with regions 14 at locations outside of the views of the drawings. Regions of the first impurities diffusion regions 13 on opposing sides of the wordline grooves 45 are isolated from one another by the third impurities diffusion regions 14.

Figure 6:
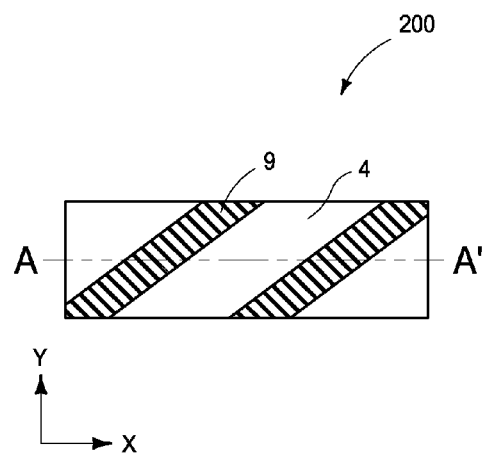
Figure 6:
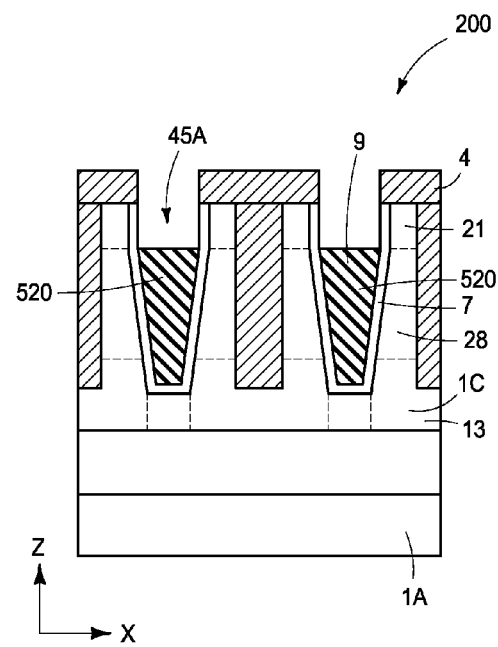

Referring to FIG. 6, the gate dielectric 7 (which may comprise, for example, silicon oxide) is formed on side surfaces of the silicon pillars 28 exposed by the wordline grooves 45. The gate dielectric may be formed by, for example, a lamp annealing method. The gate dielectric 7 is also formed on the upper surface of the silicon-containing material 1C along the bottom surfaces of the wordline grooves 45.

The conductive material 9 (which may comprise, for example, titanium nitride) is formed to partially fill the wordline grooves 45. The material 9 may have a thickness of, for example, about 20 nm; and may be formed by, for example, CVD. Conductive material 9 may comprise another conductive material in addition to, or alternatively to, titanium nitride; and may, for example, comprise tungsten and/or titanium.

Any conductive material 9 on the upper surface of the second mask 4 may be etched back (using, for example, a dry etch) to leave conductive material 9 remaining only in the lower regions (i.e., inner portions) of the wordline grooves 45. The upper surface of the remaining conductive material 9 is flush with the bottom surface of the second impurities diffusion region 21. The unfilled upper portions of the wordline grooves 45 remain as new wordline grooves 45A. The conductive material 9 of FIG. 6 may ultimately be utilized as wordlines 520.

Figure 7:
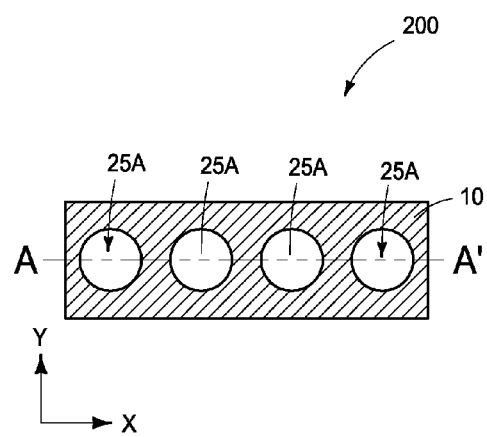
Figure 7:
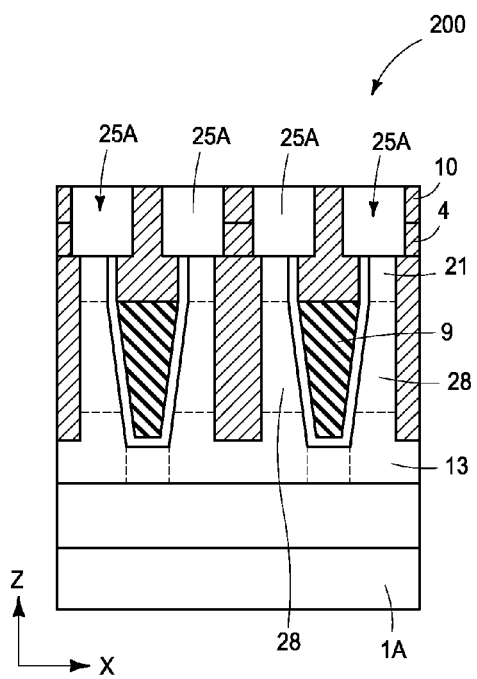

Referring to FIG. 7, dielectric 10 (for instance, silicon nitride) is formed to cover the remaining conductive material 9. The dielectric 10 may be formed by, for example, CVD. The dielectric 10 fills the wordline grooves 45A (FIG. 6) and covers an upper surface of the second mask 4.

Capacitor contact holes 25A are formed (for example, using photolithography and dry etching). The holes 25A having circular shapes in the shown embodiment, but may have other shapes in other embodiments. The contact holes 25A may have any suitable dimension, and in some embodiments may have a diameter of about 40 nm in planar view.

The second impurities diffusion region 21 is exposed through contact holes 25A. Inner surfaces of the capacitor contact holes 25A comprise regions of the second mask 4, the dielectric 10 and the silicon pillars 28. A conductive layer of polysilicon doped with phosphorus (P) may be formed within the capacitor contact holes 25A (for instance, using CVD) to provide connection with the diffusion region 21. Etch-back of the conductive layer (for instance, with dry etching), forms capacitor contact plugs 25 of polysilicon doped with phosphorus (P) within the inner portion of the capacitor contact holes 25A. In other embodiments, the plugs 25 may be formed of other suitable materials.

Referring to FIG. 8, capacitors 30 are formed by forming lower electrodes 34, capacitor dielectric material 35 and upper electrodes 36. The lower electrodes 34 are electrically coupled with the capacitor contact plugs 25.

The interlayer dielectric 44 (for instance, silicon oxide) having an example thickness of about 100 nm is formed (for example, using CVD) to cover the capacitors 30. A wafer supporting substrate 60 (for instance, glass) is adhered to the upper surface of the interlayer dielectric 44.

Figure 10:
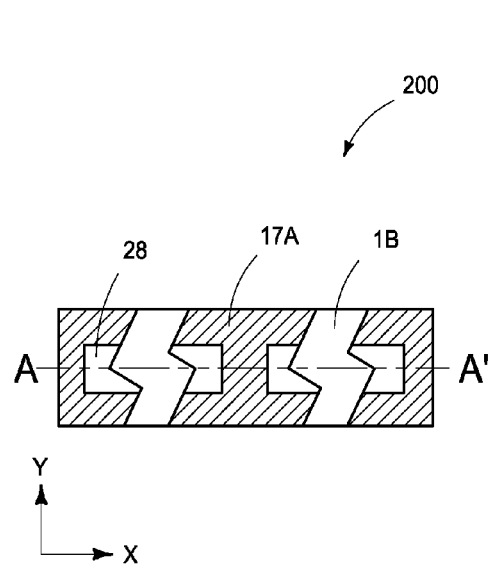
Figure 10:
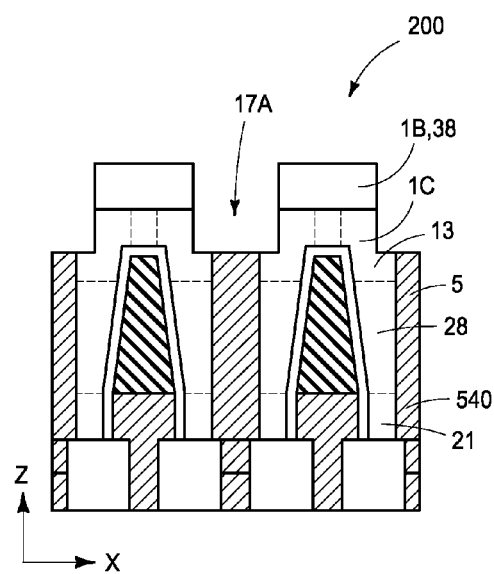
Figure 11:
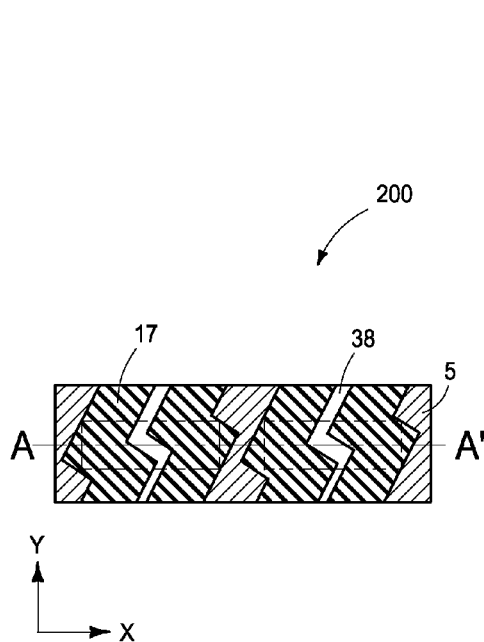
Figure 11:
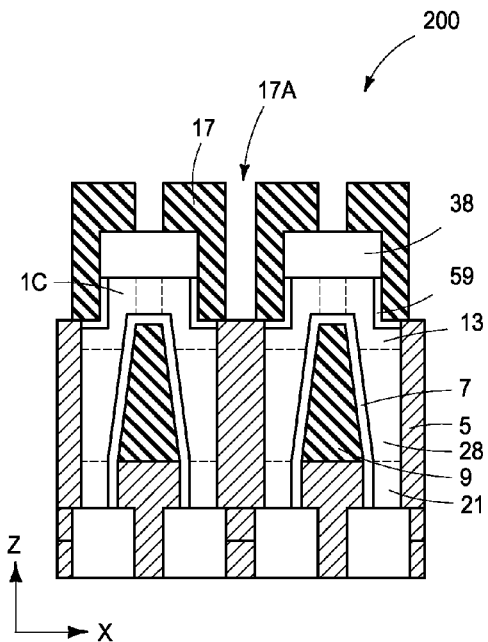

FIGS. 9-11 are shown reversed (i.e., upside down) relative to FIGS. 2-8 for convenience of explanation. Accordingly, upper surfaces of the component elements of FIGS. 2-8 are recited to be the lower surfaces in FIGS. 9-11, and the lower surfaces of component elements of FIGS. 2-8 are recited to be the upper surfaces in FIGS. 9-11.

Referring to FIG. 9, silicon-containing material 1A (FIG. 8), and a part of the BOX layer 1B that is in contact with the silicon-containing material 1A, are removed (for instance, through grinding). A thickness of the remaining BOX layer 1B may be, for example, about 50 nm. The silicon oxide layer that comprises the BOX layer 1B is exposed at this stage.

FIG. 10(b) and FIG. 11(b) are within regions demarcated by the broken line 600 of FIG. 9.

Referring to FIG. 10, a part of the silicon-containing material 1C located upward of the silicon pillar 28 and beneath the BOX layer 1B is removed (for instance, using photolithography and dry etching). A remaining part of the silicon-containing material 1C is patterned to form bitline grooves 17A extending along the second intermediate direction.

Exposed surfaces of silicon-containing material 1C and the BOX layer 1B may be together referred to as a second main surface of the silicon substrate. The side surface and the upper surface of silicon-containing material 1C, and the upper surface of STI 540, are exposed within bitline grooves 17A. Bottom surfaces of the bitline grooves 17A are flush with upper surfaces of STI 540. The remaining BOX layer 1B may be referred to hereafter as a first dielectric layer 38. When no SOI substrate is used, the first dielectric layer 38 may be formed at this stage with any suitable method.

Referring to FIG. 11, a metal silicide layer 59 (for instance, nickel silicide) is formed on the exposed surface of the silicon-containing material 1C. In some embodiments, nickel silicide may be formed by sputtering nickel followed by heat treatment at about 300° C. Any excess metal (for instance, nickel) remaining in an unreacted state without silicidation may be removed. For instance, nickel may be removed with a wet etch using a solution comprising ammonium and hydrogen peroxide.

A conductive material is formed on an inner portion of the bitline grooves 17A and configured into bitlines 17. The conductive material may, for example, comprise a laminate of titanium nitride (TiN) and tungsten (W). The conductive material may be patterned to the bitlines using, for example, photolithography and dry etching. The bitlines 17 may have a linewidth of, for example, about 30 nm. The bitlines 17 cover at least the front surface of the silicide layer 59 and a part of the upper surface of the first dielectric layer 38, and extend in the second intermediate direction along one side surface of the bitline grooves 17A. The bitlines 17 are connected to the first impurities diffusion region 13 through the silicide 59. The bitlines 17 can be disposed to overlap the silicon pillars 28 and the conductive layer 9 in planar view in direction Z. Two bitlines 17 that are formed to face each other in a single bitline groove 17A, and are formed on a single first dielectric layer 38, are electrically isolated from one another and function individually.

In subsequent processing, the second dielectric layer 39 of FIG. 2(b) (for example, silicon oxide) may be formed (using, for example, CVD).

The embodiment of FIGS. 3-11 processes a Si-containing substrate from both an upper surface and an opposing lower surface. Processing the Si-containing substrate from both surfaces may enable the bitlines to be formed immediately below the capacitors. Although not shown in the drawings, the wordlines, bitlines and the body diffusion layer may be supplied with respectively suitable potentials at end portions of the memory cell region. Since the bitlines (comprised of metallic material) are formed after forming the wordlines, thermal effects on the bitlines may be less problematic relative to conventional methods so that the degree of freedom of process design is improved.

The bitlines 17 may be formed to spread and cover the upper surface of the first dielectric layer 38. Such may be advantageous in reducing the resistance of the wirings. In applications which comprise coupling with another chip (for instance, coupling to a peripheral circuit chip comprising CMOS), it is possible to advantageously connect the spread bitlines 17 with electrodes of the opposing chip.

At least some circuitry within peripheral region 300 of FIG. 1 may be formed prior to forming at least some of the above-described circuitry of the memory cell region 200, simultaneously with the forming of at least some of the circuitry of the memory cell region, and/or after forming at least some of the circuitry of memory cell region. A DRAM chip may be formed by attaching a memory cell chip to a peripheral chip. The memory cell chip may have circuitry of the type described in FIGS. 2-11.

Another example manufacturing method is described with reference to FIG. 12 to FIG. 17. This manufacturing method has a similar planar layout as the first manufacturing method of FIGS. 2-11, and the respective drawings are similar sectional views along A-A'. Although the method is described using a silicon-on-insulation (SOI) substrate as the semiconductor substrate, it is also possible to employ a Si substrate instead of the SOI substrate.

Figure 12:
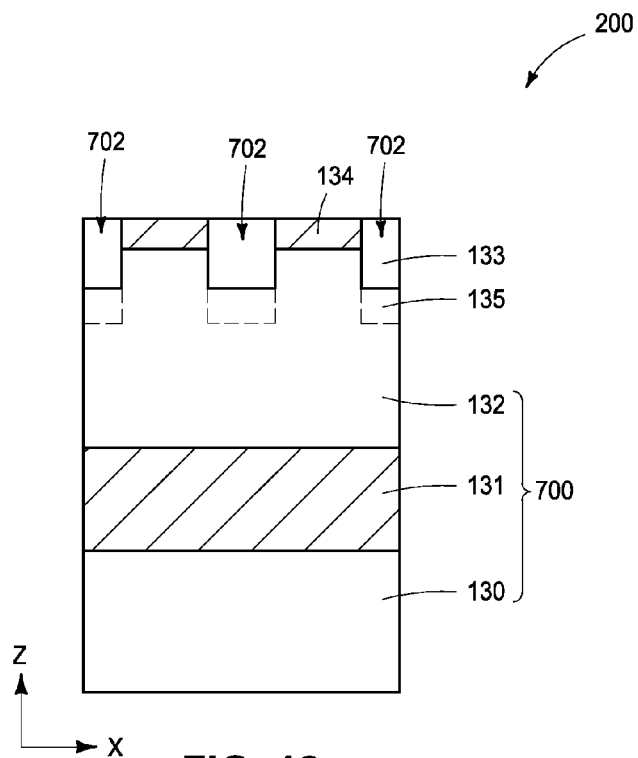
FIG. 12 to FIG. 17 are sectional views of a second example embodiment manufacturing method.

Referring to FIG. 12, a material 134 (for instance, silicon oxide) that is to be a mask for forming bit contacts is formed on an SOI substrate 700. The SOI substrate includes a silicon-containing material 130, a BOX layer 131 and another silicon-containing material 132. The silicon-containing material 132 includes a p-type diffusion layer, and may have a thickness of about 50 nm.

The oxide layer 134 and the Si substrate 132 are patterned (for instance, using dry etching) to form bitline grooves 702. Phosphorous-doped polysilicon 133 is formed within the bitline grooves (for instance, using CVD), and is etched back (for instance, using dry etching). Monocrystalline silicon may be used instead of polysilicon.

Phosphorus is diffused from the phosphorus-doped polysilicon 133 through heat treatment, and an n-type bit contact diffusion region 135 is thus formed. The n-type bit contact diffusion region 135 could be instead formed by ion implanting n-type impurities into the bitline grooves prior to forming the phosphorous-doped polysilicon 133.

Figure 13:
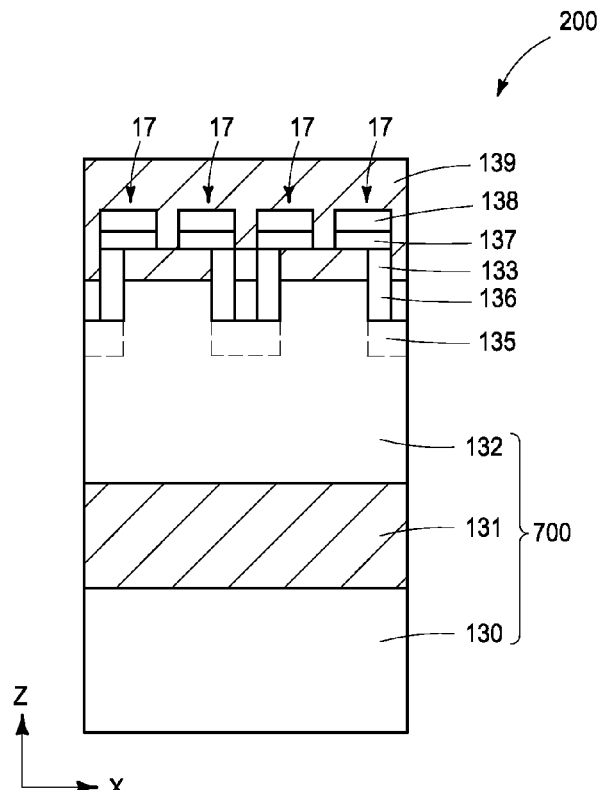

Referring to FIG. 13, titanium nitride 137 and tungsten 138 are formed (for instance, through sputtering). A bitline pattern is formed to extend through the titanium nitride, the tungsten and the phosphorous-doped polysilicon to form bitlines 17. Such may be accomplished with, for example, photolithography and dry etching. The bitlines within common bitline grooves 702 (FIG. 12) as one another are isolated from each other. Bit contacts 136 correspond to portions of conductively-doped material 133 that connect the titanium nitride 137 and the tungsten 138 with the bit contact diffusion region 135.

A silicon oxide layer 139 is formed (for instance, using CVD), and planarized (for instance, using CMP).

FIGS. 14-17 are inverted relative to FIGS. 12 and 13.

Figure 14:
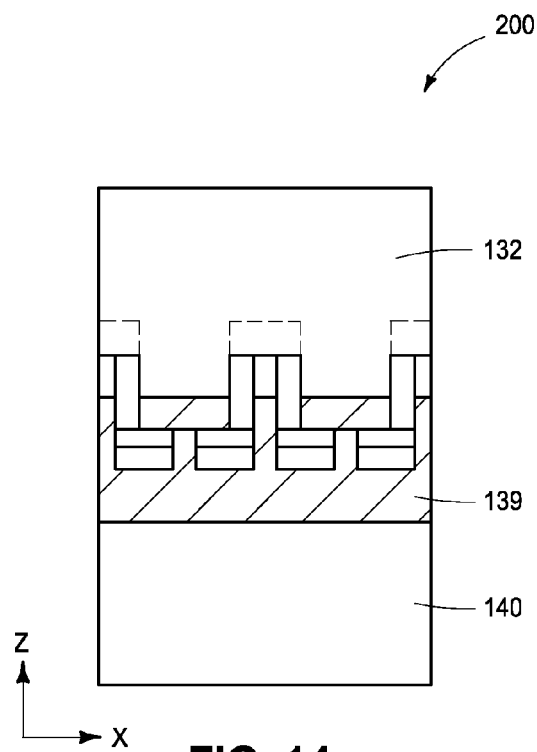

Referring to FIG. 14, a supporting substrate 140 is adhered to the silicon oxide layer 139 (for instance, through wafer bonding); and then silicon-containing material 130 (FIG. 13) is removed (for instance, by grinding), and the BOX layer 131

(FIG. 13) is removed (for instance, through wet etching) to expose the silicon-containing material 132.

Figure 15:
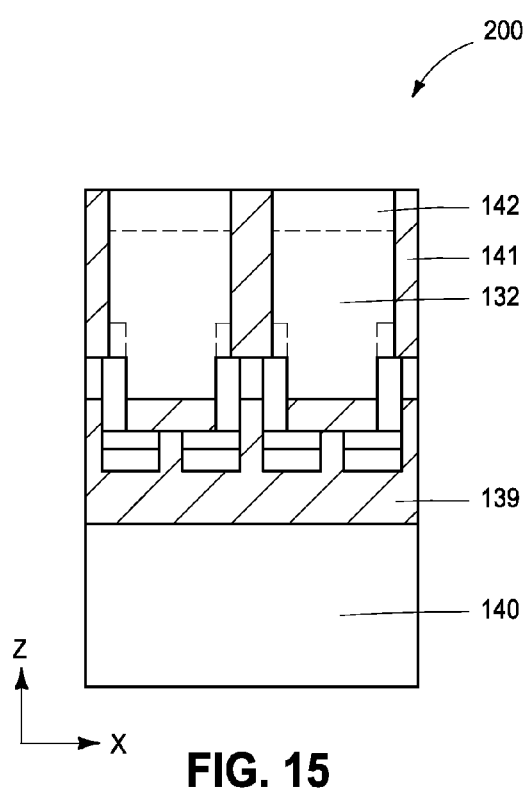

Referring to FIG. 15, after patterning an element isolating pattern on wirings (for instance with lithography), silicon is etched (for instance, dry etched). A silicon oxide layer is formed (for instance, through CVD), and the silicon oxide layer is removed (for instance, with CMP). Locations of STI 141 are defined using a mask layer (not shown). The mask layer may comprise, for example, of a silicon nitride. The STI 141 is formed, and then the mask layer is removed (for instance, through wet etching). An n-type capacitor contact diffusion layer 142 is formed (for instance, through ion implantation).

Figure 16:
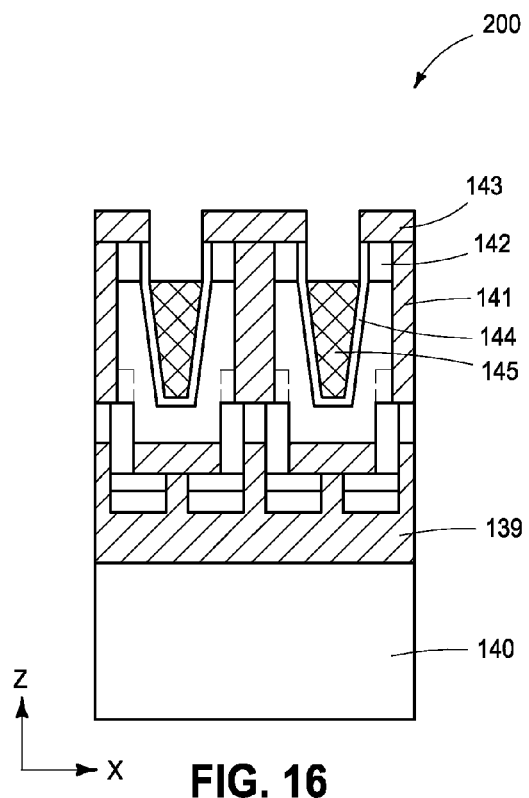

Referring to FIG. 16, a silicon oxide layer 143 is formed (for instance, through CVD); and such may have a thickness of, for example, about 50 nm. A linear pattern (which may have a width of, for example, about 20 nm) is formed (for instance, through lithography). The STI oxide layer 141 and the silicon layer 132 are etched (for instance, through dry etching) up to a depth of about 250 nm to form a groove pattern. Gate oxide 144 is formed on a side surface of the silicon layer 132 (for instance, through a lamp annealing method). Titanium nitride is formed (for instance, through CVD) to have a thickness of, for example, about 20 nm whereupon the titanium nitride is etched back (for example, through dry etching) to form wordlines 145 comprised of the titanium nitride.

Figure 17:
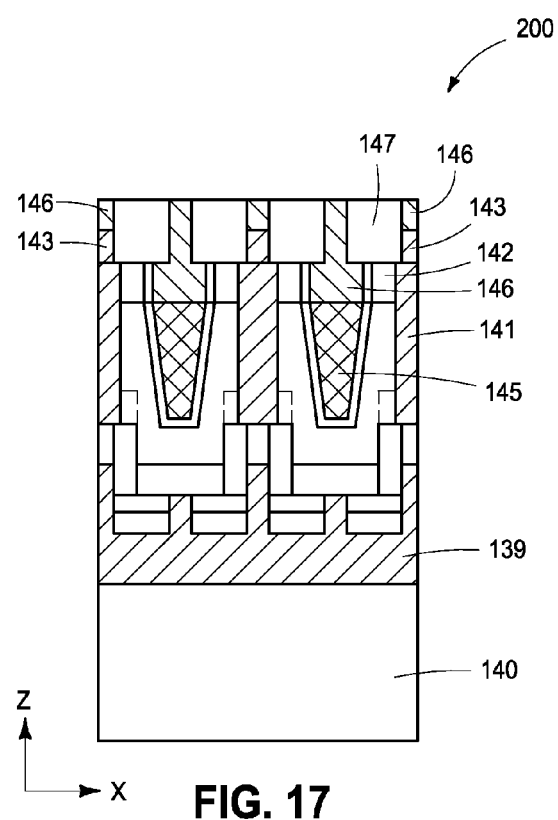

Referring to FIG. 17, silicon nitride layer 146 is formed on the wordlines 145 and the silicon oxide layer 143 (for instance, through CVD). A photoresist pattern of a capacitor contact hole (for instance, a hole of diameter of about 40 nm) is formed and used to pattern capacitor contact holes. The capacitor contact diffusion layer 142 is exposed. Thereafter, phosphorous-doped polysilicon is formed and etched back to form a capacitor contact plugs 147. The plugs 147 are connected to the capacitor contact diffusion layer 142.

Capacitors of the type shown in FIG. 2(b) may be connected to the capacitor contact plugs 147, and upper layer wirings of the type shown in FIG. 2(b) may be formed.

At least some circuitry within peripheral region 300 of FIG. 1 may be formed prior to forming at least some of the above-described circuitry of the memory cell region of FIGS. 12-17, simultaneously with the forming of at least some of the circuitry of the memory cell region, and/or after forming at least some of the circuitry of memory cell region. A DRAM chip may be formed by attaching a memory cell chip to a peripheral chip. The memory cell chip may have circuitry of the type described in FIGS. 12-17.

In the second manufacturing method, the bit contact portions are comprised of polysilicon. Accordingly, surface oxidation from processes occurring after formation of bit contact portions may be alleviated as compared to processes occurring with metal-containing bit contact portions.

In some embodiments, by performing processing from both surfaces of the substrate, it is possible to dispose gate electrodes and capacitors immediately above the bitlines when compared to a method in which forming is performed from a single side surface of the substrate. In some embodiments, it is possible to improve the degree of freedom of a layout in that the bitline width can be set to be larger than the width of active regions of the vertical MOS transistors when observed along a wordline direction. With this arrangement, it is possible to reduce the resistance of the bitlines. By performing processing from both surfaces of the substrate, it may be easier to form the vertical transistors. Potentials may be supplied at end portions of the memory cell region, which may simplify management of floating body effects.

The specific DRAM embodiments shown in the drawings utilize capacitors as charge-storage devices. In other embodiments, other suitable structure may be utilized for storing charge in addition to, or alternatively to, the capacitors.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "insulative" may be utilized to describe materials having insulative electrical properties. The terms are considered synonymous in this disclosure. The utilization of the term "dielectric" in some instances, and the term "insulative" (or "insulating") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on", "over", "beneath", "below", "under" or "against" another structure, it can be directly on the other structure or intervening structures may also be present. In contrast, when a structure is referred to as being "directly on", "directly over", "directly beneath", "directly below", "directly under" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a semiconductor construction comprising an active region (e.g., 2) surrounded by an insulating material (e.g., 540). A groove (e.g., 45) crosses the active region and divides the active region into first and second portions (e.g., 500 and 501). The first portion (e.g., 500) includes a first side surface (e.g., 507) defined by the groove and a second side surface (e.g., 508) defined by the insulating material. The second portion (e.g., 501) includes a third side surface (e.g., 509) defined by the groove and a fourth side surface (e.g., 510) defined by the insulating material. A conductive material (e.g., 9) is within the groove. A first dielectric layer (e.g., a region of dielectric material 7) is between the conductive material and the first portion of the active region, and a second dielectric layer (e.g., another region of dielectric material 7) is between the conductive material and the second portion of the active region. First and second diffusion regions (e.g., 13 and 21) are within the first portion of the active region. The first and second diffusion regions are vertically arranged to sandwich a part of the first portion therebetween (the sandwiched part may be, for example, 502). Third and fourth diffusion regions (e.g., 13 and 21) are within in the second portion of the active region. The third and fourth diffusion regions are vertically arranged to sandwich a part of the second portion therebetween (the sandwiched part may be, for example, 502). First and second conductive regions (e.g., 25 and 17) are in electrical contact with the first and second diffusion regions, respectively. Third and fourth conductive regions (e.g., 25 and 17) are in an electrical contact with the third and fourth diffusion regions, respectively.

Some embodiments include a semiconductor construction comprising a substrate (e.g., 1) which has an active region (e.g., 2) surrounded by an insulating layer (e.g., 540). A groove (e.g., 45) extends into a main surface (e.g., 530) of the substrate. The groove crosses the active region to divide the active region into first and second portions (e.g., 500 and 501). The first portion includes a first side surface (e.g., 507) defined by the groove and includes a second side surface (e.g., 508) defined by the insulating layer. The second portion includes a third side surface (e.g., 509) defined by the groove and a fourth side surface (e.g., 510) defined by the insulating layer. A wordline (e.g., 520) is within the groove. A first gate dielectric layer (e.g., 7a) is between the wordline and the first portion of the active region. A second gate dielectric layer (e.g., 7b) is between the wordline and the second portion of the active region. A first upper diffusion region (e.g., 21) and a first lower diffusion region (e.g., 13) are within the first portion of the active region. The first upper diffusion region and the first lower diffusion region are vertically arranged to sandwich a part of the first portion therebetween (the sandwiched part may be, for example, 502). The first upper diffusion region is aligned vertically over the first lower diffusion region. A second upper diffusion region (e.g., 21) and a second lower diffusion region (e.g., 13) are within the second portion of the active region. The second upper diffusion region and the second lower diffusion region are vertically arranged to sandwich a part of the second portion therebetween (the sandwiched part may be, for example, 502). The second upper diffusion region is aligned vertically over the second lower diffusion region. First and second bitlines (e.g., 17) are in electrical contact with the first and the second lower diffusion regions, respectively. First and second capacitors (e.g., 30) are in electrical contact with the first and the second upper diffusion regions, respectively.

Some embodiments include a semiconductor construction comprising first and second active regions (e.g., 2a and 2b) disposed in a first direction; and third and fourth active regions (e.g., 2c and 2d) disposed in the first direction. The first and third active regions are disposed in a second direction, and the second and fourth active regions are disposed in the second direction. The first, second, third and fourth active regions are surrounded by an insulating layer (e.g., 540). A first groove (e.g., 45a) crosses the second active region and extends along a third direction. A second groove (e.g., 45b) crosses the first and fourth active regions and extends along the third direction. A third groove (e.g., 45c) crosses the third active region and extends along the third direction. Each of the first, second and third grooves divides one or more of the first to fourth active regions into first and second portions (e.g., 500 and 501). Each of the first portions includes a first side surface defined by a one of the grooves and a second side surface defined by the insulating layer. Each of second portions includes a third side surface defined by one of the grooves and a fourth side surface defined by the insulating layer. First, second and third wordlines (e.g., 520a-c) are in the first, second and third grooves, respectively. The first, second and third wordlines extend along a third direction. The construction includes a plurality of first upper and lower diffusion regions (e.g., 21 and 13). The first upper and lower diffusion regions are in first portions of the active regions. The first upper and lower diffusion regions are vertically arranged to sandwich channel regions (e.g., 502) therebetween. The construction includes a plurality of second upper and lower diffusion regions (e.g., 21 and 13). The second upper and lower diffusion regions are in second portions of the active regions. The second upper and lower diffusion regions are vertically arranged to sandwich channel regions (e.g., 502) therebetween. A first bitline (e.g., 17b) is in electrical contact with the first lower diffusion regions of the first and third active regions. A second bitline (e.g., 17a) is in electrical contact with the second lower diffusion regions of the first and third active regions. A third bitline (e.g., 17d) is in electrical contact with the first lower diffusion regions of the second and fourth active regions. A fourth bitline (e.g., 17c) is in electrical contact with the second lower diffusion regions of the second and fourth active regions. The first, second, third and fourth bitlines extend along the second direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction comprising:
    an active region surrounded by an insulating material;
    a groove crossing the active region to divide the active region into first and second portions, the first portion including a first side surface defined by the groove and a second side surface defined by the insulating material, the second portion including a third side surface defined by the groove and a fourth side surface defined by the insulating material;
    a conductive material in the groove;
    a first dielectric layer between the conductive material and the first portion of the active region:
    a second dielectric layer between the conductive material and the second portion of the active region;
    first and second diffusion regions within the first portion of the active region, the first and second diffusion regions being vertically arranged to sandwich a part of the first Portion therebetween;
    third and fourth diffusion regions within the second portion of the active region, the third and fourth diffusion regions being vertically arranged to sandwich a part of the second portion therebetween;
    first and second conductive regions in electrical contact with the first and second diffusion regions, respectively;
    third and fourth conductive regions in electrical contact with the third and fourth diffusion regions, respectively;
    wherein a first vertical transistor includes the first and second diffusion regions, the first dielectric layer, the sandwiched part of the first portion of the active region which serves as a first channel, and a part of the conductive material that serves as a first gate electrode; and
    wherein a second vertical transistor includes the third and fourth diffusion regions, the second dielectric layer, the sandwiched part of the second portion of the active region which serves as a second channel, and a part of the conductive material that serves as a second gate electrode;

wherein the groove includes a to extending through a first main surface of a substrate, and includes a bottom beneath the top; and wherein the first and third diffusion regions are aligned vertically beneath the second and fourth diffusion regions, respectively; and wherein the first and third diffusion regions are p-type doped; and wherein the active region further comprises an n-type doped region under the groove which electrically separates the first and third diffusion regions from one another.

2. The construction of claim 1 wherein the first and third conductive regions include first and second bitlines respectively.

3. The construction of claim 2 wherein the first and second bitlines include metal.

4. The construction of claim 1 wherein the second and fourth conductive regions include first and second contact plugs, respectively.

5. The construction of claim 4 further comprising first and second capacitors electrically connected with the second and fourth conductive regions respectively.

6. The construction of claim 1 wherein the conductive material extends along a first direction; and wherein the first and third conductive regions extend along a second direction other than the first direction.

7. The construction of claim 6 wherein a width of the first conductive region is larger than a width of the first portion of the active region when measured along the first direction.

8. The construction of claim 7 wherein the first portion of the active region includes an end portion aligned vertically over the first conductive region.

9. The construction of claim 1 further comprising a memory cell area and a peripheral area, and wherein the first and second vertical transistors are disposed in the memory cell area.

10. The construction of claim 1 wherein the second conductive region, the first diffusion region and the second diffusion region are aligned vertically above the first conductive region; and wherein the fourth conductive region, the third diffusion region and the fourth diffusion region are aligned vertically above the third conductive region.

11. A semiconductor construction comprising:
a substrate which has an active region surrounded by an insulating layer;
a groove extending into a main surface of the substrate, the groove crossing the active region to divide the active region into first and second portions, the first portion including a first side surface defined by the groove and a second side surface defined by the insulating layer, the second portion including a third side surface defined by the groove and a fourth side surface defined by the insulating layer,
a wordline within the groove; a first gate dielectric layer between the wordline and the first portion of the active region; a second gate dielectric layer between the wordline and the second portion of the active region;
a first upper diffusion region and a first lower diffusion region in the first portion of the active region, the first upper diffusion region and the first lower diffusion region being vertically arranged to sandwich a part of the first portion therebetween, the first upper diffusion region being over the first lower diffusion region;
a second upper diffusion region and a second lower diffusion region in the second portion of the active region, the second upper diffusion region and the second lower diffusion region being vertically arranged to sandwich a part of the second portion therebetween, the second upper diffusion region being over the second lower diffusion region; the first and second lower diffusion regions being of a first conductivity type, and being spaced from one another by an intervening region having a second conductivity type;
first and second bitlines in electrical contact with the first and the second lower diffusion regions, respectively; and
first and second capacitors in electrical contact with the first and the second upper diffusion regions, respectively; the first capacitor having a first lower electrode and the second capacitor having a second lower electrode, with the first and second lower electrodes being separate from one another.

12. The construction of claim 11 wherein the first capacitor, the first upper diffusion region, and the first lower diffusion region are aligned vertically over the first bitline; and wherein the second capacitor, the second upper diffusion region, and the second lower diffusion region are aligned vertically over the second bitline.

13. The construction of claim 11 wherein:
the wordline extends along a first direction, and
a width of the first bitline is larger than a width of the first portion of the active region when measured along the first direction.

14. A semiconductor construction comprising:
first and second active regions being disposed in a first direction;
third and fourth active regions being disposed in the first direction, the first and third active regions being disposed in a second direction and the second and fourth active regions being disposed in the second direction;
a first groove crossing the second active region and extending along a third direction; a second groove crossing the first and fourth active regions and extending along the third direction; a third groove crossing the third active region, the third groove extending along the third direction; wherein each of the first, second and third grooves divides one or more of the first to fourth active regions into first and second portions, each of the first portions includes a first side surface defined by one of the grooves and a second side surface defined by an insulating material, each of second portions includes a third side surface defined by one of grooves and a fourth side surface defined by the insulating material;
first, second and third wordlines in the first, second and third grooves, respectively; the first, second and third wordlines extending along a third direction;
a plurality of first upper and lower diffusion regions within first portions of the active regions, each of the first upper and lower diffusion regions being vertically arranged to sandwich channel regions therebetween;
a plurality of second upper and lower diffusion regions within second portions of the active regions, each of the second upper and lower diffusion regions being vertically arranged to sandwich channel regions therebetween;
a first bitline in electrical contact with the first lower diffusion regions of the first and third active regions;
a second bitline in electrical contact with the second lower diffusion regions of the first and third active regions;

a third bitline in electrical contact with the first lower diffusion regions of the second and fourth active regions; and a fourth bitline in electrical contact with the second lower diffusion regions of the second and fourth active regions; wherein the first, second, third and fourth bitlines extend along the second direction.

15. The construction of claim 14 further comprising a plurality of charge-storage devices being in electrical contact with a corresponding one of the plurality of first upper diffusion regions or a corresponding one of the plurality of second upper diffusion regions.

16. The construction of claim 15 wherein the charge-storage devices comprise capacitors; and wherein the first upper diffusion region of the first active region, the first lower diffusion region of the first active region, and the capacitor in electrical contact with the first upper diffusion region of the first active region, are vertically stacked and aligned above the first bitline.

17. The construction of claim 14 wherein a width of the first bitline is larger than a width of the first portion of the first active region when measured along the third direction.

* * * * *